United States Patent
Wang

(10) Patent No.: US 11,961,853 B2
(45) Date of Patent: Apr. 16, 2024

(54) COLOR FILTER SUBSTRATE AND MANUFACTURING METHOD THEREOF

(71) Applicant: Shenzhen China Star Optoelectronics Semiconductor Display Technology Co., Ltd., Guangdong (CN)

(72) Inventor: Haijun Wang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 472 days.

(21) Appl. No.: 17/298,630

(22) PCT Filed: May 28, 2021

(86) PCT No.: PCT/CN2021/096788
§ 371 (c)(1),
(2) Date: May 31, 2021

(87) PCT Pub. No.: WO2022/170693
PCT Pub. Date: Aug. 18, 2022

(65) Prior Publication Data
US 2023/0352498 A1 Nov. 2, 2023

(30) Foreign Application Priority Data
Feb. 10, 2021 (CN) .......................... 202110184839.5

(51) Int. Cl.
*G06F 3/042* (2006.01)
*G02F 1/1335* (2006.01)
*H01L 27/144* (2006.01)

(52) U.S. Cl.
CPC .... *H01L 27/1443* (2013.01); *G02F 1/133514* (2013.01); *G06F 3/042* (2013.01)

(58) Field of Classification Search
None
See application file for complete search history.

(56) References Cited

U.S. PATENT DOCUMENTS

| 2011/0018893 | A1  | 1/2011  | Kim et al. |
| 2012/0249504 | A1  | 10/2012 | Kim et al. |
| 2013/0027356 | A1* | 1/2013  | Nishida ................. G06F 3/0412 345/175 |
| 2017/0048516 | A1* | 2/2017  | Yang ...................... H10K 59/50 |
| 2021/0132715 | A1* | 5/2021  | Shin ........................ G06F 3/044 |

FOREIGN PATENT DOCUMENTS

| CN | 104330915   | 2/2015  |
| CN | 111965876   | 11/2020 |
| KR | 2018-0126779 | 11/2018 |

\* cited by examiner

Primary Examiner — Matthew Yeung

(57) ABSTRACT

A color filter substrate and a manufacturing method thereof are provided. A plurality of grating structures, a sensor unit and a switch unit are integrated on the color filter substrate. As such, in addition to an original light-filtering function, the color filter substrate is given functions of polarizing light rays and sensing light rays.

17 Claims, 3 Drawing Sheets

COLOR FILTER SUBSTRATE AND MANUFACTURING METHOD THEREOF

RELATED APPLICATIONS

This application is a National Phase of PCT Patent Application No. PCT/CN2021/096788 having International filing date of May 28, 2021, which claims the benefit of priority of Chinese Patent Application No. 202110184839.5 filed on Feb. 10, 2021. The contents of the above applications are all incorporated by reference as if fully set forth herein in their entirety.

FIELD AND BACKGROUND OF THE INVENTION

The present invention relates to display technologies, and more particularly, to a color filter substrate and a manufacturing method thereof.

Liquid crystal display devices are widely used in current display industries for they have advantages of low power consumption, no radiation and low manufacture cost. In order to broaden the functions of the liquid crystal display devices for commercial use and household use, many functions (e.g., color temperature sensing, laser sensing, gas sensing and etc.) are usually incorporated into the liquid crystal display devices. As such, scenarios to which the liquid crystal display devices can be applied are improved.

FIG. 1 is an existing liquid crystal display device having a laser sensing function. The liquid crystal display device includes a display part 100 and a sensing part 200. The display part 100 includes a lower polarizer 101, and a thin-film transistor array substrate 102, a liquid crystal layer 103, a color filter substrate 104 and an upper polarizer 105 that are sequentially disposed on the lower polarizer 101. The sensing part 200 includes a first adhering glue 201, and a sensing substrate 202, a second adhering glue 203 and a cover plate 204 that are sequentially disposed on the first adhering glue 201. The liquid crystal display device is formed by attaching the display part 100 to the sensing part 200 with the first adhering glue 201 and by attaching the sensing substrate 202 to the cover plate 204 with the second adhering glue 203. When a laser (e.g., laser light generated from a laser pen) irradiates at sensing units (not shown) of the sensing substrate 202, electric current signals will be generated. After the electric current signals are read out and are transmitted to the display part 100, a color change (e.g., a light spot) is made at a corresponding position on the display part 100.

However, because all of the first adhering glue 201, the second adhering glue 203 and the cover plate 204 have considerable thickness, the overall thickness of the liquid crystal display device will increase and this limits the promotion and application in the market. Therefore, it needs to provide a color filter substrate and a manufacturing method thereof for reducing the overall thickness of the liquid crystal display device.

SUMMARY OF THE INVENTION

An objective of the present invention is to provide a color filter substrate and a manufacturing method thereof, for solving the problems existing in the existing arts.

To achieve above objective, a first aspect of the present invention provides a color filter substrate, including a base substrate, the color filter substrate further including:

a plurality of color filters, disposed on the base substrate;

a plurality of grating structures, disposed at a side of the base substrate, configured to generate polarized light;

a sensor unit, disposed at a side of the base substrate, configured to generate an electric current signal after irradiated by a laser; and a switch unit, disposed at a side of the base substrate as the same as the sensor unit and connected to the sensor unit, configured to receive the electric current signal and allow the electric current signal to pass through the switch unit in response to the switch unit being in a switched-on state, wherein the both the sensor unit and the switch unit are thin-film transistors, and the plurality of grating structures, the sensor unit and the switch unit are integrated on the color filter substrate.

For further details, the sensor unit includes a first source electrode and a first drain electrode, the switch unit includes a second source electrode and a second drain electrode, the first drain electrode is connected to a connecting line connected to an external power source, the first source electrode is connected to the second source electrode, and the second drain electrode is connected to a readout line configured to read out the electric current signal.

For further details, the sensor unit and the switch unit at least include a first gate electrode and a second gate electrode, respectively, a material of the first gate electrode and the second gate electrode is a transparent conductive material, and the color filter substrate further includes:

a light shielding layer, wherein the light shielding layer and the switch unit are disposed at opposite sides of the base substrate, and the light shielding layer is disposed corresponding to the second gate electrode and is configured to prevent the laser from irradiating the switch unit to affect a switch function of the switch unit.

For further details, the sensor unit at least includes a first gate electrode, a first source electrode and a first drain electrode, each of the grating structures includes a first grating structure and a second grating structure, the second grating structure stacks on a corresponding first grating structure, a material of the first grating structure and a material of the first gate electrode are a same material and belong to a same film layer, and a material of the second grating structure and a material of the first source electrode or the first drain electrode are a same material and belong to a same film layer.

For further details, the color filter substrate further includes:

an insulating layer, covering the plurality of grating structures, configured to insulate the grating structures.

For further details, the plurality of color filters are disposed at a first side of the base substrate, the plurality of grating structures, the sensor unit and the switch unit are disposed at a second side of the base substrate, and the first side is opposite to the second side.

For further details, the plurality of color filters, the plurality of grating structures, the sensor unit and the switch unit are disposed at a same side of the base substrate.

A second aspect of the present invention provides a color filter substrate, including a base substrate, the color filter substrate further including:

a plurality of grating structures, disposed at a side of the base substrate, configured to generate polarized light;

a sensor unit, disposed at a side of the base substrate, configured to generate an electric current signal after irradiated by a laser; and a switch unit, disposed at a side of the base substrate as the same as the sensor unit and connected to the sensor unit, configured to receive the electric current signal and allow the electric current signal to pass through the switch unit in response to the switch unit being in a switched-on state, wherein the plurality of grating structures, the sensor unit and the switch unit are disposed on the color filter substrate.

For further details, both the sensor unit and the switch unit are thin-film transistors, the sensor unit includes a first source electrode and a first drain electrode, the switch unit includes a second source electrode and a second drain electrode, the first drain electrode is connected to a connecting line connected to an external power source, the first source electrode is connected to the second source electrode, and the second drain electrode is connected to a readout line configured to read out the electric current signal.

For further details, both the sensor unit and the switch unit are thin-film transistors and at least include a first gate electrode and a second gate electrode, respectively, a material of the first gate electrode and the second gate electrode is a transparent conductive material, and the color filter substrate further includes:

a light shielding layer, wherein the light shielding layer and the switch unit are disposed at opposite sides of the base substrate, and the light shielding layer is disposed corresponding to the second gate electrode and is configured to prevent the laser from irradiating the switch unit to affect a switch function of the switch unit.

For further details, the sensor unit is a thin-film transistor and at least includes a first gate electrode, a first source electrode and a first drain electrode, each of the grating structures includes a first grating structure and a second grating structure, the second grating structure stacks on a corresponding first grating structure, a material of the first grating structure and a material of the first gate electrode are a same material and belong to a same film layer, and a material of the second grating structure and a material of the first source electrode or the first drain electrode are a same material and belong to a same film layer.

For further details, the color filter substrate further includes:

an insulating layer, covering the plurality of grating structures, configured to insulate the grating structures.

For further details, the color filter substrate further includes a plurality of color filters disposed on the base substrate, wherein the plurality of color filters are disposed at a first side of the base substrate, the plurality of grating structures, the sensor unit and the switch unit are disposed at a second side of the base substrate, and the first side is opposite to the second side.

For further details, the color filter substrate further includes a plurality of color filters disposed on the base substrate, wherein the plurality of color filters, the plurality of grating structures, the sensor unit and the switch unit are disposed at a same side of the base substrate.

A third aspect of the present invention provides a method for manufacturing a color filter substrate, the method including the steps of:

forming a plurality of grating structures, a sensor unit and a switch unit at a side of a base substrate, wherein the sensor unit is configured to generate an electric current signal after irradiated by a laser, the switch unit is connected to the sensor unit and is configured to receive the electric current signal and allow the electric current signal to pass through the switch unit in response to the switch unit being in a switched-on state, and the plurality of grating structures are configured to generate polarized light; and wherein the plurality of grating structures, the sensor unit and the switch unit are disposed on the color filter substrate.

For further details, the plurality of grating structures, the sensor unit and the switch unit are integrated on the color filter substrate.

For further details, both the sensor unit and the switch unit are thin-film transistors, the sensor unit includes a first source electrode and a first drain electrode, the switch unit includes a second source electrode and a second drain electrode, the first drain electrode is connected to a connecting line connected to an external power source, the first source electrode is connected to the second source electrode, and the second drain electrode is connected to a readout line configured to read out the electric current signal.

For further details, both the sensor unit and the switch unit are thin-film transistors and at least include a first gate electrode and a second gate electrode, respectively, a material of the first gate electrode and the second gate electrode is a transparent conductive material, and the method further includes:

forming a light shielding layer, wherein the light shielding layer and the switch unit are disposed at opposite sides of the base substrate, and the light shielding layer is disposed corresponding to the second gate electrode and is configured to prevent the laser from irradiating the switch unit to affect a switch function of the switch unit.

For further details, the sensor unit is a thin-film transistor and at least includes a first gate electrode, a first source electrode and a first drain electrode, each of the grating structures includes a first grating structure and a second grating structure, the second grating structure stacks on a corresponding first grating structure, a material of the first grating structure and a material of the first gate electrode are a same material and belong to a same film layer, and a material of the second grating structure and a material of the first source electrode or the first drain electrode are a same material and belong to a same film layer.

For further details, the color filter substrate further includes a plurality of color filters disposed on the base substrate, wherein the plurality of color filters are disposed at a first side of the base substrate, the plurality of grating structures, the sensor unit and the switch unit are disposed at a second side of the base substrate, and the first side is opposite to the second side.

In the present invention, the plurality of grating structures, the sensor unit and the switch unit are integrated on the color filter substrate. As such, in addition to an original light-filtering function, the color filter substrate is given functions of polarizing light rays and sensing light rays. Compared to the existing art, the liquid crystal display device of the present invention at least reduces the thickness of an upper polarizer, an adhering glue and a cover plate, thereby effectively reducing the thickness of the liquid crystal display device, and further increases the energy of the laser arriving at the sensor unit 30 and improves light-electronic conversion efficiency, thereby improving sensibility of detection on the laser.

DESCRIPTION OF SPECIFIC EMBODIMENTS OF THE INVENTION

To make the objectives, technical schemes, and effects of the present invention more clear and specific, the present invention is described in further detail below with reference to the appending drawings. It should be understood that the specific embodiments described herein are merely for interpreting the present invention and the present invention is not limited thereto.

The following descriptions on the respective embodiments are specific embodiments capable of being implemented for illustration of the present invention with referring to the appending drawings. In describing the present invention, spatially relative terms are used as illustrated in the figures. Therefore, the spatially relative terms used herein are intended to illustrate the present invention for ease of understanding, but are not intended to limit the present invention.

Figure 1:
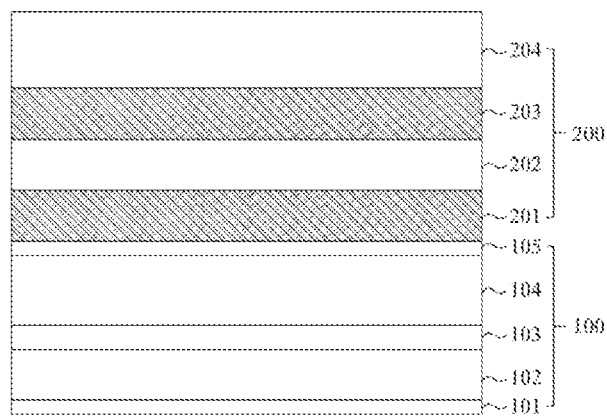
FIG. 1 is an existing liquid crystal display device having a laser sensing function.
Figure 2:
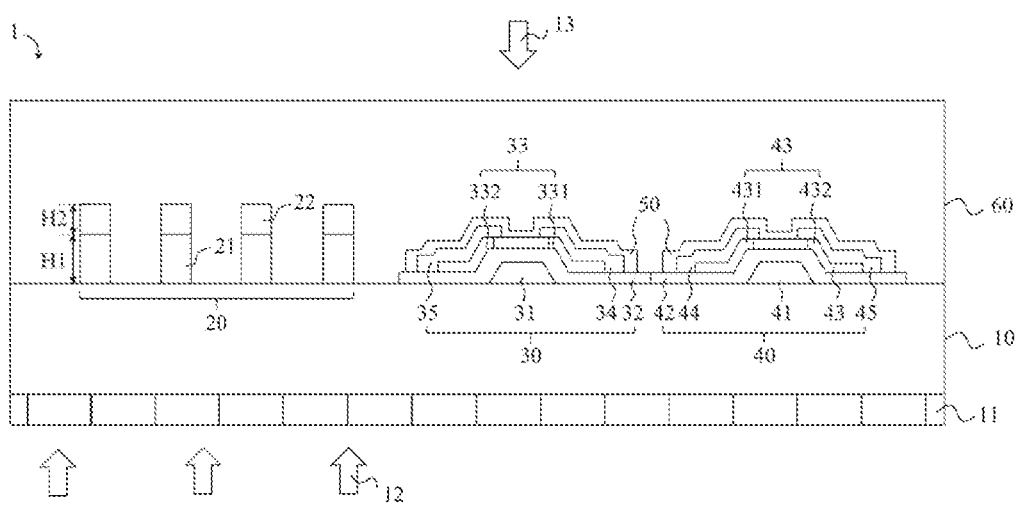
FIG. 2 is a side view of a color filter substrate according to a first embodiment of the present invention.

FIG. 2 is a side view of a color filter substrate 1 according to a first embodiment of the present invention. The color filter substrate 1 includes a base substrate 10 and a plurality of color filters 11 disposed on the base substrate 10.

In the present embodiment, the color filter substrate 1 further includes a plurality of grating structures 20, a sensor unit 30 and a switch unit 40. The plurality of grating structures 20 are disposed at a side of the base substrate 10 and are configured to generate polarized light from the light 12 (shown by upward bold arrows in FIG. 2) passing through the plurality of color filters 11. The sensor unit 30 is disposed at a side of the base substrate 10 and is configured to generate an electric current signal after irradiated by a laser 13 (shown by a downward bold arrow in FIG. 2). The switch unit 40 is disposed at a side of the base substrate 10 as the same as the sensor unit 30, is connected to the sensor unit 30 and is configured to receive the electric current signal and allow the electric current signal to pass through the switch unit 40 in response to the switch unit 40 being in a switched-on state. The plurality of grating structures 20, the sensor unit 30 and the switch unit 40 are disposed on the color filter substrate 1.

In the present embodiment, the plurality of grating structures 20, the sensor unit 30 and the switch unit 40 are preferably disposed at a same side of the base substrate 10 for forming a part of film layers simultaneously (this will be described later) and reducing processes for manufacturing the color filter substrate 1. Specifically, the plurality of color filters 11 are disposed at a first side of the base substrate 10, the plurality of grating structures 20, the sensor unit 30 and the switch unit 40 are disposed at a second side of the base substrate 10, and the first side is opposite to the second side. In an embodiment, the plurality of color filters 11 can also be disposed at a side of the base substrate 10 as the same as the plurality of grating structures 20, the sensor unit 30 and the switch unit 40.

In the present embodiment, the plurality of grating structures 20 can be of a grating consisted of black and white bars that are arranged periodically and can also be a sine-wave grating with a regular arrangement, and the arrangement of the plurality of grating structures 20 is not limited in the present application.

In the present embodiment, the sensor unit 30 can be a photodiode, such as a thin-film transistor, having a structure similar to a PIN diode. Specifically, When the sensor unit 30 is the thin-film transistor, the sensor unit 30 includes a first gate electrode 31, a first gate insulating layer 32, a first active layer 33, a first source electrode 34 and a first drain electrode 35. The first gate electrode 31 is disposed on the base substrate 10. The first gate insulating layer 32 covers the first gate electrode 31. The first active layer 33 is disposed on the first gate insulating layer 32 and includes a first source 331 and a first drain 332 disposed at two sides of the first active layer 33, respectively. The first source electrode 34 and the first drain electrode 35 are disposed on the first active layer 33 and are electrically connected to the first source 331 and the first drain 332, respectively.

For more details, the first source electrode 34 is connected to the switch unit 40, and the first source 331 and the first drain 332 may be doped with N-type ions (e.g., phosphorus ions) or P-type ions (boron ions), forming a photodiode having a structure similar to a PIN diode. When the sensor unit 30 is irradiated by the laser 13, electron PIN ole pairs will be generated in the first active layer 33 at an area having no doped ions. After an external power source is applied to the first drain 332, electrons or holes of the electron-hole pairs will move toward the switch unit 40 via the first source electrode 34 so as to form the electric current signal. The switch unit 40 is configured to receive the electric current signal. Specifically, the switch unit 40 is switched on according to predetermined timing. When the switch unit 40 is in a switched-on state, the electric current signal can pass through the switch unit 40. For more details, signal conversion can be performed on the electric current signal passing through the switch unit 40 by using field programmable gate array (FPGA) or firmware, and the position where the laser irradiates at a display panel is eventually obtained.

In the present embodiment, the switch unit 40 can be a thin-film transistor having a switch function. Specifically, When the switch unit 40 is the thin-film transistor, the switch unit 40 includes a second gate electrode 41, a second gate insulating layer 42, a second active layer 43, a second source electrode 44 and a second drain electrode 45. The second gate electrode 41 is disposed on the base substrate 10. The second gate insulating layer 42 covers the second gate electrode 41. The second active layer 43 is disposed on the second gate insulating layer 42 and includes a second source 431 and a second drain 432. The second source electrode 44 and the second drain electrode 45 are disposed on the second active layer 43 and are electrically connected to the second source 431 and the second drain 432, respectively.

Figure 3:
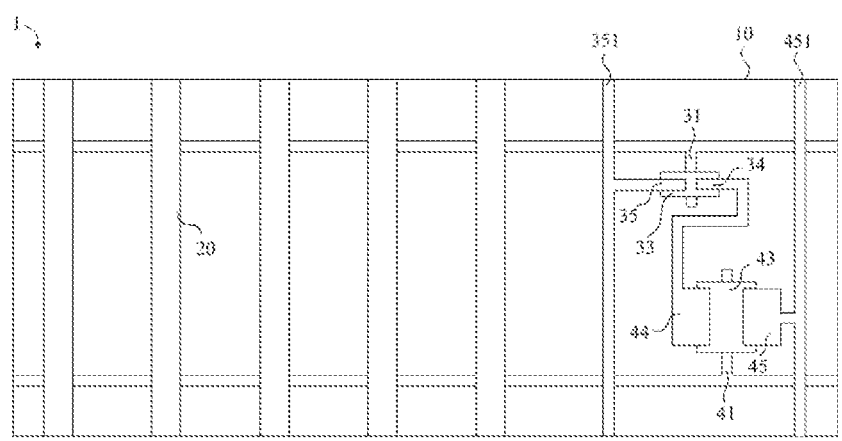
FIG. 3 is a top view of a color filter substrate according to a first embodiment of the present invention.

As shown in FIG. 3, the first source electrode 34 is connected to the second source electrode 44. When the sensor unit 30 is irradiated by the laser 13, electron PIN ole pairs will be generated in the first active layer 33 at an area having no doped ions. After an external power source is applied to a connecting line 351 connecting to the first drain electrode 35, electrons or holes of the electron-hole pairs will move toward the second source electrode 44 via the first source electrode 34 so as to form the electric current signal.

Moreover, the timing to switch on and switch off the switch unit 40 can be controlled by the second gate electrode 41 connecting to a timing controller (not shown), that is, the switch unit 40 can be switched on according to predetermined timing. When the switch unit 40 is in a switched-on state, the electric current signal can be transmitted to the second drain electrode 45 and is read out via a readout line 451 connecting to the second drain electrode 45.

It can be understood that although both the sensor unit 30 and the switch unit 40 of the present embodiment are thin-film transistors, the two units can be deployed as thin-film transistors having different spectral responses, that is, having different responses for different light wavelengths or frequencies. Because the switch unit 40 can be deployed by a thin-film transistor that is unable to response to the laser 13, the switch function of the switch unit 40 can be prevented from being affected by the laser when the sensor unit 30 is irradiated by the laser 13.

In the present embodiment, each of the grating structures includes a first grating structure 21 having a first height H1 and a second grating structure 22 having a second height H2. The second grating structure 22 stacks on a corresponding first grating structure 21. At the time of forming the first gate electrode 31, the first grating structure 21 is formed on the base substrate 10, that is, a material of the first grating structure 21 and a material of the first gate electrode 31 are a same material and belong to a same film layer. At the time of forming the first source electrode 34 and the first drain electrode 35, the second grating structure 22 is formed on the corresponding first grating structure 21, that is, a material of the second grating structure 22 and a material of the first source electrode 34 or the first drain electrode 35 are a same material and belong to a same film layer. In an embodiment, each of the grating structures 20 may include only the first grating structure 21 (a material of the first grating structure 21 can be the same as a material of any of the first gate electrode 31, the first source electrode 34 and the first drain electrode 35). In order to make the light 12 passing through the plurality of color filters 11 generate the polarized light having a same polarization effect, it can be realized by adjusting the height of the first grating structure 21 to a sum of the first height H1 and the second height H2. It can be understood that a better polarization effect may be achieved by adjusting the height of the first grating structure 21 to a height greater than a sum of the first height H1 and the second height H2.

Figure 6:
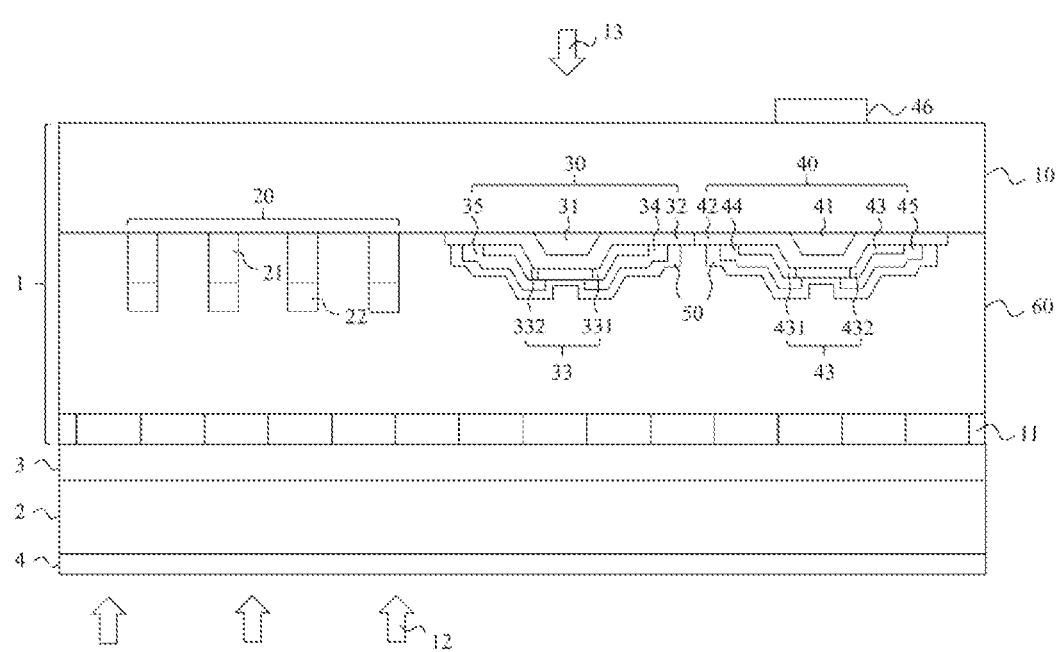
FIG. 6 is a schematic diagram illustrating a liquid crystal display device according to a fourth embodiment of the present invention.

If the sensor unit 30 and the switch unit 40 are disposed at a side of the base substrate 10 different from the laser 13 (as shown in FIG. 6), when the laser 13 irradiates at the sensor unit 30, the material of the first gate electrode 31 has to be a transparent conductive material so as to make the first active layer 33 generate the electric current signal after irradiated by the laser 13. Moreover, when the material of the second gate electrode 41 is also a transparent conductive material, a light shielding layer 46 corresponding to the second gate electrode 41 can be disposed on the base substrate 10 at a side of the base substrate 10 opposite to the switch unit 40 so as to prevent the laser 13 from affecting the switch function of the switch unit 40 (this will be described later).

In the present embodiment, the color filter substrate 1 further includes an insulating layer 50, which can cover the sensor unit 30 and the switch unit 40 (as shown in FIG. 2) and can also cover the plurality of grating structures 20, the sensor unit 30 and the switch unit 40. The insulating layer 50 is configured to insulate different parts or components.

In the present embodiment, the color filter substrate 1 further includes a protection layer 60 for covering and protecting the plurality of grating structures 20, the sensor unit 30 and the switch unit 40.

Figure 4A:
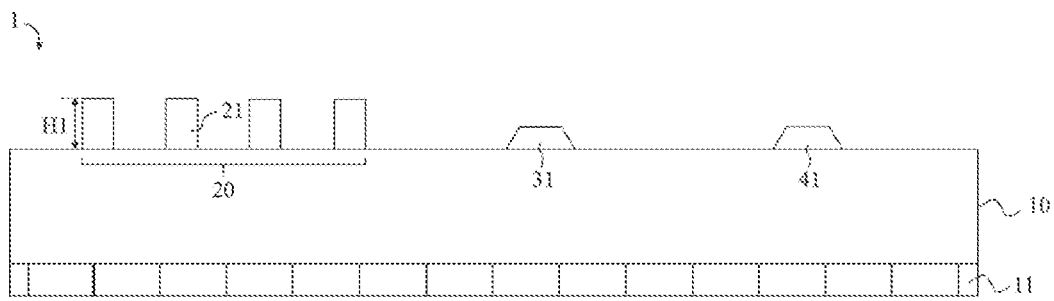
FIGS. 4A, 4B and 4C are diagrams illustrating steps of a method for manufacturing a color filter substrate according to a second embodiment of the present invention.
Figure 4B:
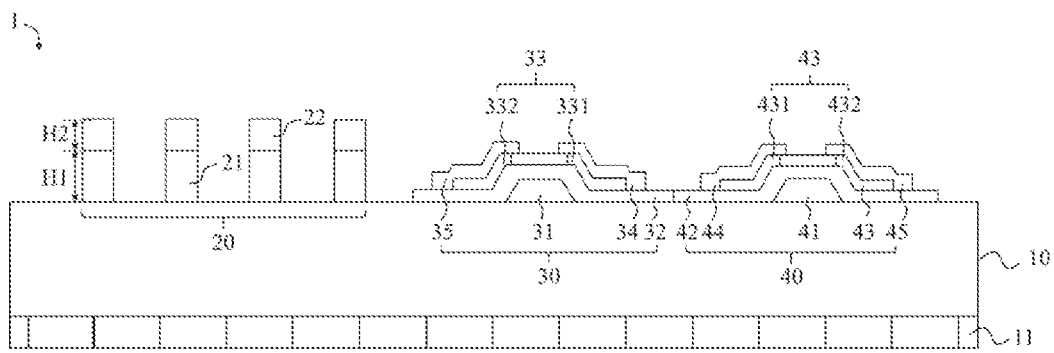
Figure 4C:
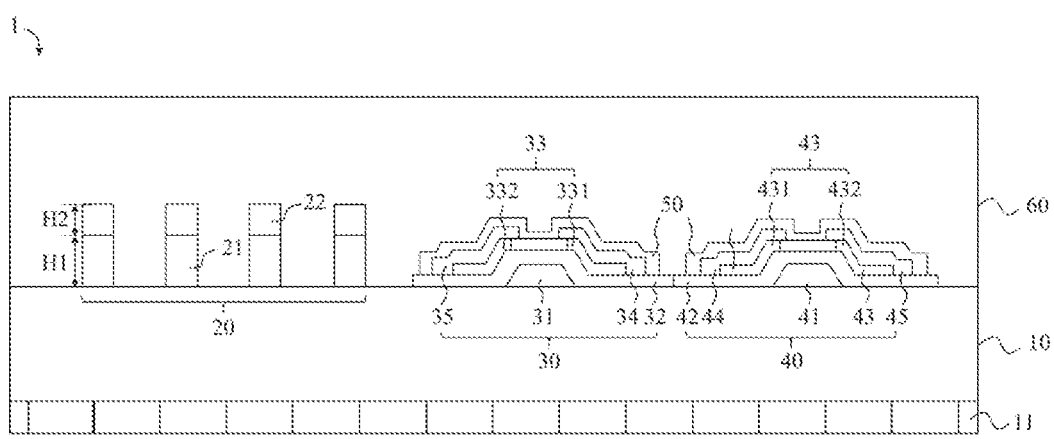

FIGS. 4A to 4C are diagrams illustrating steps of a method for manufacturing a color filter substrate 1 according to a second embodiment of the present invention. Please refer to FIGS. 4A to 4C with reference to FIG. 2 for more details. The color filter substrate 1 includes a base substrate 10 and a plurality of color filters 11 disposed on the base substrate 10. The method includes a step of:

forming a plurality of grating structures 20, a sensor unit 30 and a switch unit 40 at a side of the base substrate 10.

The plurality of grating structures 20 are configured to generate polarized light. The sensor unit 30 is configured to generate an electric current signal after irradiated by a laser 13. The switch unit 40 is connected to the sensor unit 30 and is configured to receive the electric current signal and allow the electric current signal to pass through the switch unit 40 in response to the switch unit 40 being in a switched-on state. The plurality of grating structures 20, the sensor unit 30 and the switch unit 40 are disposed on the color filter substrate 1.

Preferably, the plurality of grating structures 20, the sensor unit 30 and the switch unit 40 are disposed at a same side of the base substrate 10 for forming a part of film layers simultaneously and reducing processes for manufacturing the color filter substrate 1.

For more details, when the sensor unit 30 is a thin-film transistor, the forming the sensor unit 30 includes:

forming a first gate electrode 31 on the base substrate 10;

forming a first gate insulating layer 32 to cover the first gate electrode 31;

forming a first active layer 33 on the first gate insulating layer 32, wherein the first active layer 33 includes a first source 331 and a first drain 332 disposed at two sides of the first active layer 33, respectively; and forming a first source electrode 34 and a first drain electrode 35 on the first active layer 33, wherein the first source electrode 34 and the second drain electrode 35 are electrically connected to the first source 331 and the first drain 332, respectively.

For more details, when the switch unit 40 is a thin-film transistor, the switch unit 40 can be manufactured as the time of manufacturing the sensor unit and the forming the switch unit 40 includes:

at the time of forming the first gate electrode 31, forming a second gate electrode 41 on the base substrate 10;

at the time of forming the first gate insulating layer 32, forming a second gate insulating layer 42 to cover the second gate electrode 41;

at the time of forming the first active layer 33, forming a second active layer 43 on the second gate insulating layer 42, wherein the second active layer 43 includes a second source 431 and a second drain 432 disposed at two sides of the second active layer 43, respectively; and at the time of forming the first source electrode 34 and the first drain electrode 35, forming a second source electrode 44 and a second drain electrode 45 on the second active layer 43, wherein the second source electrode 44 and the second drain electrode 45 are electrically connected to the second source 431 and the second drain 432, respectively.

The first source electrode 34 is connected to the second source electrode 44.

For more details, the forming the plurality of grating structures 20 includes:

forming a first grating structure 21 of each of the grating structures 20, wherein the first grating structure 21 and the first gate electrode 31 are formed under a same mask process (as shown in FIG. 4A); and forming a second grating structure 22 of each of the grating structures at a position corresponding to the first grating structure 21, wherein the second grating structure 22 stacks on a corresponding first grating structure 21, and the second grating structure 22 and the first source electrode 34 (or the first drain electrode 35 are formed under a same mask process (as shown in FIG. 4B)).

It needs to be noted that the plurality of grating structures 20, the sensor unit 30 and the switch unit 40 may also be manufactured separately, and the present invention is not limited to afore-described manufacturing processes.

In the present embodiment, the method further includes the steps of (as shown in FIG. 4C):

forming an insulating layer 50 to cover the plurality of grating structures 20, the sensor unit 30 and the switch unit 40; and forming a protection layer 60 to cover and protect the plurality of grating structures, the sensor unit and the switch unit.

It can be understood that for more details of the second embodiment of the present invention, it can be referred to the content of the first embodiment of the present invention, which is not repeated herein.

Figure 5:
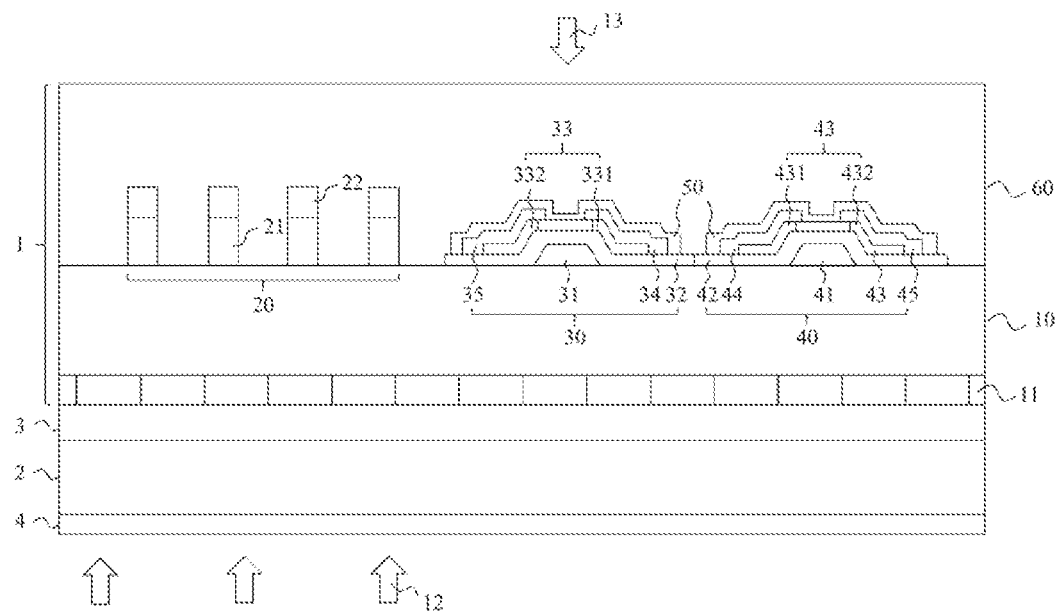
FIG. 5 is a schematic diagram illustrating a liquid crystal display device according to a third embodiment of the present invention.

FIG. 5 is a schematic diagram illustrating a liquid crystal display device according to a third embodiment of the present invention.

In the present embodiment, the liquid crystal display device includes a thin-film-transistor (TFT) array substrate 2, a color filter substrate 1 and a liquid crystal layer 3. The color filter substrate 1 is disposed opposite to the TFT array substrate and includes the afore-described color filter substrate 1, which is not repeated herein. The liquid crystal layer 3 is disposed between the TFT array substrate 2 and the color filter substrate 1.

In the present embodiment, the plurality of grating structures 20, the sensor unit 30 and the switch unit 40 are disposed at a side of the base substrate 10 away from the TFT array substrate 2, and the plurality of color filters 11 are disposed at a side of the base substrate 10 facing the TFT array substrate 2. In an embodiment, the plurality of grating structures 20, the sensor unit 30, the switch unit 40 and the plurality of color filters 11 are all disposed at a side of the base substrate 10 away from the TFT array substrate 2.

In the present embodiment, the liquid crystal display device further includes a lower polarizer 4 disposed at a side of the TFT array substrate 2 away from the color filter substrate 1 for generating polarized light from the light emitted by a backlight source (not shown).

It can be understood that for more details of the third embodiment of the present invention, it can be referred to the content of the first embodiment and the second embodiment of the present invention, which is not repeated herein.

FIG. 6 is a schematic diagram illustrating a liquid crystal display device according to a fourth embodiment of the present invention. The differences between the fourth embodiment and the third embodiment of the present invention are that in the fourth embodiment, the plurality of grating structures 20, the sensor unit 30, the switch unit 40 and the plurality of color filters 11 are all disposed at a same side of the base substrate 10 facing the TFT array substrate 2.

In the present embodiment, when the laser 13 irradiates at the sensor unit 30, if the sensor unit 30 is a thin-film transistor of a bottom-gate structure, that is, the first gate electrode 31 is disposed on the base substrate 10 (as shown in FIG. 2), then the material of the first gate electrode 31 has to be a transparent conductive material so as to make the first active layer 33 generate the electric current signal after irradiated by the laser 13. If the sensor unit 30 is a thin-film transistor of a top-gate structure, that is, the first active layer is disposed on the base substrate 10, it can make the first active layer generate the electric current signal after irradiated by the laser 13 no matter whether the material of the first gate electrode is a transparent conductive material or a non-transparent conductive material.

In the present embodiment, when the laser 13 irradiates at the sensor unit 30, if the switch unit 40 is likewise a thin-film transistor of a bottom-gate structure, that is, the second gate electrode 41 is disposed on the base substrate 10 (as shown in FIG. 2), and the switch unit 40 will not response to the laser 13, then the material of the second gate electrode 41 can be a non-transparent conductive material or a transparent conductive material.

However, if the switch unit 40 will response to the laser 13 and the material of the second gate electrode 41 is a transparent conductive material, a light shielding layer 46 corresponding to the second gate electrode 41 can be disposed at a side of the base substrate 10 away from the TFT array substrate 2 for preventing the laser 13 from affecting the switch function of the switch unit 40.

It needs to be noted that descriptions on all of foregoing embodiments can be referred together.

It can be understood that a person of ordinary skill in the art may further make modifications to obtain different embodiments within the spirit and principles of the present invention, and the present invention is not limited to foregoing embodiments.

In the present invention, the plurality of grating structures 20, the sensor unit 30 and the switch unit 40 are integrated on the color filter substrate 1. As such, in addition to an original light-filtering function, the color filter substrate 1 is given functions of polarizing light rays and sensing light rays. Compared to the existing art, the liquid crystal display device of the present invention at least reduces the thickness of an upper polarizer, an adhering glue and a cover plate, thereby effectively reducing the thickness of the liquid crystal display device, and further increases the energy of the laser 13 arriving at the sensor unit 30 and improves light-electronic conversion efficiency, thereby improving sensibility of detection on the laser.

While the preferred embodiments of the present application have been illustrated and described in detail, various modifications and alterations can be made by persons skilled in this art. The embodiment of the present application is therefore described in an illustrative but not restrictive sense. It is intended that the present application should not be limited to the particular forms as illustrated, and that all modifications and alterations which maintain the realm of the present application are within the scope as defined in the appended claims.

The invention claimed is:

1. A color filter substrate, comprising a base substrate, the color filter substrate further comprising:

a plurality of color filters, disposed on the base substrate;

a plurality of grating structures, disposed at a side of the base substrate, configured to generate polarized light;

a sensor unit, disposed at a side of the base substrate, configured to generate an electric current signal after irradiated by a laser; and a switch unit, disposed at a side of the base substrate as the same as the sensor unit and connected to the sensor unit, configured to receive the electric current signal and allow the electric current signal to pass through the switch unit in response to the switch unit being in a switched-on state, wherein the both the sensor unit and the switch unit are thin-film transistors, and the plurality of grating structures, the sensor unit and the switch unit are integrated on the color filter substrate, wherein the sensor unit at least comprises a first gate electrode, a first source electrode and a first drain electrode, each of the grating structures comprises a first grating structure and a second grating structure, the second grating structure stacks on a corresponding first grating structure, a material of the first grating structure and a material of the first gate electrode are a same material and belong to a same film layer, and a material of the second grating structure and a material of the first source electrode or the first drain electrode are a same material and belong to a same film layer.

2. The color filter substrate according to claim 1, wherein the switch unit comprises a second source electrode and a second drain electrode, the first drain electrode is connected to a connecting line connected to an external power source, the first source electrode is connected to the second source electrode, and the second drain electrode is connected to a readout line configured to read out the electric current signal.

3. The color filter substrate according to claim 1, wherein the switch unit at least comprises a second gate electrode, a material of the first gate electrode and the second gate electrode is a transparent conductive material, and the color filter substrate further comprises:

a light shielding layer, wherein the light shielding layer and the switch unit are disposed at opposite sides of the base substrate, and the light shielding layer is disposed corresponding to the second gate electrode and is configured to prevent the laser from irradiating the switch unit to affect a switch function of the switch unit.

4. The color filter substrate according to claim 1, further comprising:

an insulating layer, covering the plurality of grating structures, configured to insulate the grating structures.

5. The color filter substrate according to claim 1, wherein the plurality of color filters are disposed at a first side of the base substrate, the plurality of grating structures, the sensor unit and the switch unit are disposed at a second side of the base substrate, and the first side is opposite to the second side.

6. The color filter substrate according to claim 1, wherein the plurality of color filters, the plurality of grating structures, the sensor unit and the switch unit are disposed at a same side of the base substrate.

7. A color filter substrate, comprising a base substrate, the color filter substrate further comprising:

a plurality of grating structures, disposed at a side of the base substrate, configured to generate polarized light;

a sensor unit, disposed at a side of the base substrate, configured to generate an electric current signal after irradiated by a laser; and a switch unit, disposed at a side of the base substrate as the same as the sensor unit and connected to the sensor unit, configured to receive the electric current signal and allow the electric current signal to pass through the switch unit in response to the switch unit being in a switched-on state, wherein the plurality of grating structures, the sensor unit and the switch unit are disposed on the color filter substrates wherein the sensor unit is a thin-film transistor and at least comprises a first gate electrode, a first source electrode and a first drain electrode, each of the grating structures comprises a first grating structure and a second grating structure, the second grating structure stacks on a corresponding first grating structure, a material of the first grating structure and a material of the first gate electrode are a same material and belong to a same film layer, and a material of the second grating structure and a material of the first source electrode or the first drain electrode are a same material and belong to a same film layer.

8. The color filter substrate according to claim 7, wherein both the sensor unit and the switch unit are thin-film transistors, the switch unit comprises a second source electrode and a second drain electrode, the first drain electrode is connected to a connecting line connected to an external power source, the first source electrode is connected to the second source electrode, and the second drain electrode is connected to a readout line configured to read out the electric current signal.

9. The color filter substrate according to claim 7, wherein both the sensor unit and the switch unit are thin-film transistors and the switch unit at least comprises a second gate electrode, a material of the first gate electrode and the second gate electrode is a transparent conductive material, and the color filter substrate further comprises:

a light shielding layer, wherein the light shielding layer and the switch unit are disposed at opposite sides of the base substrate, and the light shielding layer is disposed corresponding to the second gate electrode and is configured to prevent the laser from irradiating the switch unit to affect a switch function of the switch unit.

10. The color filter substrate according to claim 7, further comprising:

an insulating layer, covering the plurality of grating structures, configured to insulate the grating structures.

11. The color filter substrate according to claim 7, further comprising a plurality of color filters disposed on the base substrate, wherein the plurality of color filters are disposed at a first side of the base substrate, the plurality of grating structures, the sensor unit and the switch unit are disposed at a second side of the base substrate, and the first side is opposite to the second side.

12. The color filter substrate according to claim 7, further comprising a plurality of color filters disposed on the base substrate, wherein the plurality of color filters, the plurality of grating structures, the sensor unit and the switch unit are disposed at a same side of the base substrate.

13. A method for manufacturing a color filter substrate, the method comprising the steps of:

forming a plurality of grating structures, a sensor unit and a switch unit at a side of a base substrate, wherein the sensor unit is configured to generate an electric current signal after irradiated by a laser, the switch unit is connected to the sensor unit and is configured to receive the electric current signal and allow the electric current signal to pass through the switch unit in response to the switch unit being in a switched-on state, and the plurality of grating structures are configured to generate polarized light; and wherein the plurality of grating structures, the sensor unit and the switch unit are disposed on the color filter substrate, wherein the sensor unit is a thin-film transistor and at least comprises a first gate electrode, a first source electrode and a first drain electrode, each of the grating structures comprises a first grating structure and a second grating structure, the second grating structure stacks on a corresponding first grating structure, a material of the first grating structure and a material of the first gate electrode are a same material and belong to a same film layer, and a material of the second grating structure and a material of the first source electrode or the first drain electrode are a same material and belong to a same film layer.

14. The method for manufacturing the color filter substrate according to claim 13, wherein the plurality of grating structures, the sensor unit and the switch unit are integrated on the color filter substrate.

15. The method for manufacturing the color filter substrate according to claim 13, wherein both the sensor unit and the switch unit are thin-film transistors, the switch unit comprises a second source electrode and a second drain electrode, the first drain electrode is connected to a connecting line connected to an external power source, the first source electrode is connected to the second source electrode, and the second drain electrode is connected to a readout line configured to read out the electric current signal.

16. The method for manufacturing the color filter substrate according to claim 13, wherein both the sensor unit and the switch unit are thin-film transistors and the switch unit at least comprises a second gate electrode, a material of the first gate electrode and the second gate electrode is a transparent conductive material, and the method further comprises:

forming a light shielding layer, wherein the light shielding layer and the switch unit are disposed at opposite sides of the base substrate, and the light shielding layer is disposed corresponding to the second gate electrode and is configured to prevent the laser from irradiating the switch unit to affect a switch function of the switch unit.

17. The method for manufacturing the color filter substrate according to claim 13, wherein the color filter substrate further comprises a plurality of color filters disposed on the base substrate, the plurality of color filters are disposed at a first side of the base substrate, the plurality of grating structures, the sensor unit and the switch unit are disposed at a second side of the base substrate, and the first side is opposite to the second side.

* * * * *